(12) United States Patent
Denham (10) Patent No.: US 7,273,289 B2
(45) Date of Patent: Sep. 25, 2007

(54) VACUUM COMPATIBLE, HIGH-SPEED, 2-D MIRROR TILT STAGE

(75) Inventor: Paul E. Denham, Crockett, CA (US)

(73) Assignee: Euv LLC, Santa Clara, CA (US)

(*) Notice: Subject to any disclaimer, the term of this patent is extended or adjusted under 35 U.S.C. 154(b) by 264 days.

(21) Appl. No.: 11/132,783

(22) Filed: May 19, 2005

(65) Prior Publication Data

US 2006/0262435 A1  Nov. 23, 2006

(51) Int. Cl.
G02B 7/182 (2006.01)
(52) U.S. Cl. .................... 359/872; 359/225
(58) Field of Classification Search .......... None
See application file for complete search history.

(56) References Cited

U.S. PATENT DOCUMENTS

| | | | |
|---|---|---|---|
| 4,090,745 A | 5/1978 | Dohogne | 308/10 |
| 4,175,832 A * | 11/1979 | Umeki et al. | 359/225 |
| 4,285,552 A | 8/1981 | Sutter | 308/10 |
| 4,383,763 A | 5/1983 | Hutchings | 356/350 |
| 4,660,941 A | 4/1987 | Hattori | 350/487 |
| 4,691,212 A | 9/1987 | Solcz | 346/108 |
| 4,708,420 A | 11/1987 | Liddiard | 350/6.6 |
| 4,831,246 A | 5/1989 | Wallentine | 250/20 |
| 5,170,277 A | 12/1992 | Bard | 359/210 |
| 5,276,545 A * | 1/1994 | Daun et al. | 359/198 |
| 5,803,609 A | 9/1998 | Stacklies | 384/2 |
| 6,220,561 B1 | 4/2001 | Garcia | 248/487 |
| 6,327,102 B1 | 12/2001 | Naulleau | 359/802 |
| 6,353,271 B1 | 3/2002 | Williams | 310/12 |
| 6,442,851 B1 | 9/2002 | Botos | 33/1 |
| 6,588,081 B2 | 7/2003 | Botos | 29/281.5 |
| 6,717,653 B2 | 4/2004 | Iwamoto | 355/72 |
| 6,798,494 B2 | 9/2004 | Naulleau | 355/67 |
| 6,807,740 B2 | 10/2004 | Reed | 33/286 |
| 6,813,055 B2 * | 11/2004 | Childers et al. | 359/224 |
| 2002/0066869 A1 | 6/2002 | Nguyen | |

* cited by examiner

*Primary Examiner*—Euncha P. Cherry
(74) *Attorney, Agent, or Firm*—Cascio Schmoyer & Zervas

(57) ABSTRACT

A compact and vacuum compatible magnetic-coil driven tiltable stage that is equipped with a high efficiency reflective coating can be employed as a scanner in EUV applications. The drive electronics for the scanner is fully in situ programmable and rapidly switchable.

20 Claims, 7 Drawing Sheets

VACUUM COMPATIBLE, HIGH-SPEED, 2-D MIRROR TILT STAGE

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

The invention relates to a light deflection technique for deflecting light in a desired direction by tilting a reflecting mirror in the direction of x-axis or y-axis of a plane according to the application of an electric signal. Specific scan patterns can be generated by maneuvering the reflecting mirror through a desired range of angles in two dimensions.

BACKGROUND OF THE INVENTION

The ability to scan laser beams by way of reflection from a tiltable mirror serves many purposes in optics. The most general of tilt scanners provide two-dimensional angle scanning from a single reflective surface and are fully programmable. In the visible-light regime, this is typically achieved by using a piezo tilt stage. Piezo tilters, however, have rather a small angle scanning range and require expensive high-voltage drive electronics.

For example, a tilting mirror arrangement used for scanning is described in U.S. Pat. No. 4,708,420 to Liddiard. For this device, a scanning mirror is connected via flexible joints to piezoceramic drive elements that are arranged parallel to the mirror surface. This scanning device is complex and the scanning mirror arrangement is very large so that the piezoceramic drive elements can tilt the mirror through a large angle. This results from the small deflection of the piezoceramic drive elements, which is proportional to the length of these elements. This arrangement is thus not suited to tilt small mirrors through a large angular range when the drive mechanism behind the tilting mirror is to be limited to the dimensions of the mirror surface.

U.S. Pat. No. 4,383,763 to Hutchings et al. describes a tilting mirror apparatus in which the mirror is mounted on a tilting point and is moved by piezoelectric ceramics. Here also, the dimensions of the mirror have to be very large if the tilting mirror is to be tilted through at least 1 degree.

U.S. Pat. No. 4,660,941 to Hattori et al describes a tilting mirror in which the movement of the tilting mirror is effected by piezoelectric elements which act on the mirror via levers. This arrangement is also not suitable for tilting a small mirror through at least 1 degree.

A piezoelectric beam reflector is described in U.S. Pat. No. 5,170,277 to Bard in which the mirror member is directly attached to the piezoelectric element. This device has the disadvantage that the mirror has no defined pivot point when pivoting. Finally, U.S. Pat. No. 4,691,212 to Solcz et al. describes a piezoelectric beam reflector that is used in a scanning arrangement. The disadvantage of this apparatus is that a given deflection angle cannot be rigidly maintained when the pivot point is to remain stationary. As is apparent, the art is in need of a compact tiltable mirror that has a large scanning angle range.

In a related area, extreme ultraviolet (EUV) lithography is an emerging technology in the microelectronics industry. It is one of the leading candidates for the fabrication of devices with feature sizes of 70 nm and smaller. Synchrotron radiation facilities provide a convenient source of EUV radiation for the development of this technology. Though not under serious consideration for high-volume commercial fabrication applications, synchrotron sources play an extremely important role in the development of EUV lithography technology. Being readily available, highly reliable, and efficient producers of EUV radiation, synchrotron radiation sources are well suited to the development of EUV lithography. These sources are currently used for a variety of at-wavelength EUV metrologies such as reflectometry, interferometry and scatterometry.

In the case of synchrotron radiation sources, there are three types of sources: bending magnets, wigglers, and undulators. In bending magnet sources, the electrons are deflected by a bending magnet and photon radiation is emitted. Wiggler sources comprise a so-called wiggler for the deflection of the electron or of an electron beam. The wiggler includes a multiple number of alternating poled pairs of magnets arranged in a series. When an electron passes through a wiggler, the electron is subjected to a periodic, vertical magnetic field; the electron oscillates correspondingly in the horizontal plane. Wigglers are further characterized by the fact that no coherency effects occur. The synchrotron radiation produced by a wiggler is similar to that of a bending magnet and radiates in a horizontal steradian. In contrast to the bending magnet, it has a flow that is reinforced by the number of poles of the wiggler.

Finally, in the case of undulator sources, the electrons in the undulator are subjected to a magnetic field with shorter periods and a smaller magnetic field of the deflection pole than in the case of the wiggler, so that interference effects of synchrotron radiation occur. Due to the interference effects, the synchrotron radiation has a discontinuous spectrum and radiates both horizontally and vertically in a small steradian element, i.e., the radiation is strongly directed.

In lithographic applications, the partial coherence of the illumination (sigma) is often defined as the ratio of the illumination angular range to the numerical aperture of the imaging (projection optical) system. The illumination angular range is also referred to as the divergence of the source. Undulator radiation is much like a laser source in that it produces highly-coherent light of very low divergence. A typical EUV undulator beamline produces a sigma of less than 0.1 whereas lithographic applications nominally require a sigma of 0.5 or higher. Although less coherent than undulator radiation, bending magnet radiation is also typically too coherent to be directly used for lithography.

As EUV lithography technology matures, more lithographic printing stations will be required for resist and process development. Proliferation of these systems has been slowed by the lack of reliable and cost-effective EUV sources. It would be greatly desirable to alleviate the dearth of EUV sources for lithographic process development applications in the form of small-field static microsteppers through the use synchrotron radiation. The relatively high coherence of these sources, however, has precluded them from being used more extensively for actual lithography studies. Relevant process development applications require much more incoherence than is inherently provided by synchrotron sources. This is especially true of undulator sources that otherwise would be highly desirable for their large EUV power capabilities.

A new coherence controlling illuminator that is described in U.S. Pat. No. 6,798,494 to Naulleau addressed some of these problems. This illuminator allows the effective coherence of a synchrotron beamline to be tailored to photolithography applications by using an angular scanning element and a stationary low-cost spherical mirror to re-image the scanning mirror to the reticle plane of the lithographic optic. One significant advantage of this illumination system is that it enables the generation of arbitrary divergence patterns by way of controlling the particular scan configuration. This is of great importance for lithographic process development systems as it enables a single illumination system and source to model a wide variety of divergence patterns that might be generated by the variety of commercial sources and illuminators under development. Hence one process development tool would enable a large number commercial-style tools to be simulated in terms of illumination divergence characteristics greatly increasing the utility of the process development tool.

By design the Naulleau illuminator enables in si tu arbitrary control of the illumination coherence properties (or pupil fill), however, achieving arbitrary and switchable control of the pupil fill requires specialized electronics. In early implementations of the scanning illuminator, conventional function generators were used to generate the scan signals but this made it very difficult to change illumination properties and to achieve complicated fill patterns. What is needed are fully in situ programmable and rapidly switchable drive electronics meeting the requirements of a lithographic process development tool.

SUMMARY OF THE INVENTION

The present invention is based in part on the development of a magnetic-coil driven tiltable stage which can be made extremely compact and vacuum compatible thereby allowing it to be readily used in the vacuum ultraviolet and extreme ultraviolet regimes as well as the visible-light regime. Moreover, thick-substrate-glass mirrors, which serve as ideal substrates for high efficiency reflective coatings, can be incorporated into the stage to operate as scanners. Such coatings are crucial for near-normal-incidence EUV applications. The drive electronics for the scanner is fully in situ programmable and rapidly switchable.

In one aspect, the invention is directed to a mirror mounted tilt stage that includes: (a) a base unit, (b) a frame having a mirror mounted thereon wherein the mirror has a reflective surface, (c) a single pivot member having a distal end that is attached to the base unit and a proximal end that pivotally supports the frame such that the frame can pivot in two directions, (d) at least one actuator for tilting the frame; and (e) means for driving the actuators to move the reflective surface through a desired range of angles in two nonparallel, preferably orthogonal, planes.

In another aspect, the invention is directed to method for producing a reflected light scan pattern that includes the steps of: (a) providing a mirror mounted tilt stage as described above, (b) directing a beam of light into the reflective surface, (c) moving the reflective surface through a range of angles in two nonparallel planes to scan the beam through a set of angles to create the scan pattern on a target plane such as the entrance pupil of an illumination optics.

DETAILED DESCRIPTION OF THE PREFERRED EMBODIMENTS

Figure 1:
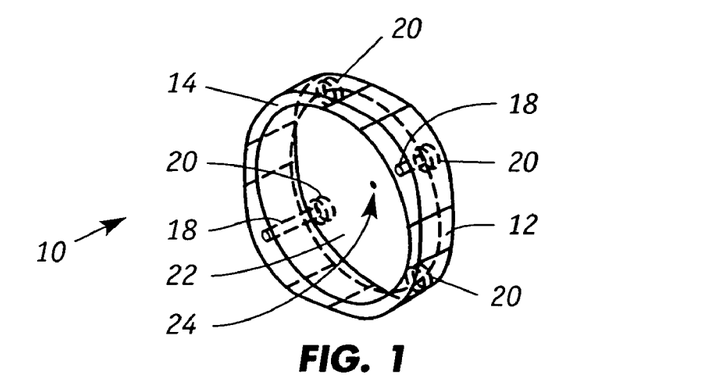
FIG. 1 shows a partially exposed perspective of an embodiment of the tilt stage.

FIG. 1 illustrates the tilt stage 10 which includes an annular ring member 12 having an upper peripheral surface 14 and a base 22 that has four mounts 20 attached to the exterior surface thereof. The base has an aperture or indentation 24 that is dimensioned to accommodate the tip of an elastic bending wire so that the tilt stage 10 is supported and balanced by the wire. The annular ring has two threaded bores 18 that can accommodate threaded screws for attaching a mirror as further described herein.

Figure 2A:
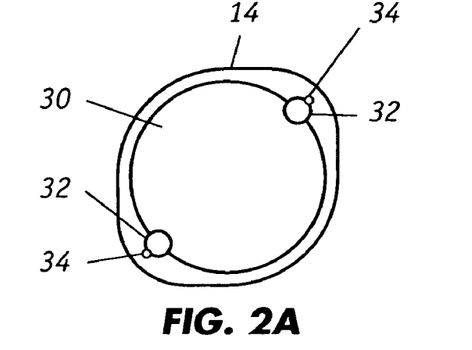
FIGS. 2A and 2B are the and top and bottom plan views, respectively, of the tilt stage.

As shown in FIG. 2A, a mirror 30 is mounted on the top surface 14 of the tilt stage and fastened by brackets 32 that are secured by screws 34. The mirror can be any suitable reflective surface. For laser applications, the mirror comprises a substrate onto which a multilayer coating of alternating dielectric material is deposited. For extreme ultraviolet (EUV) radiation applications, a multilayer reflection coating consisting of a stack of alternating layers of molybdenum and silicon can be employed.

Figure 2B:
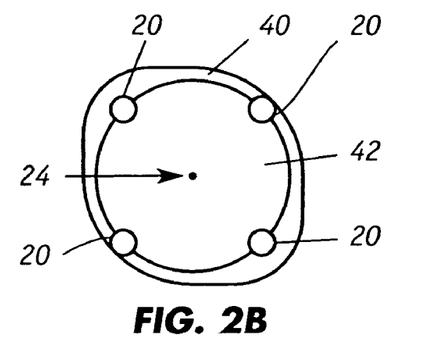

As shown in FIG. 2B, the exterior surface 42 of the base 22 has a support point in the form of an aperture or indentation 24 that is preferably formed on the middle of the exterior surface 42. The exterior 42 has four mounts 20 that are preferably located equal distance from the aperture 24 with opposite mounts and the aperture 24 defining is a diameter.

Figure 3:
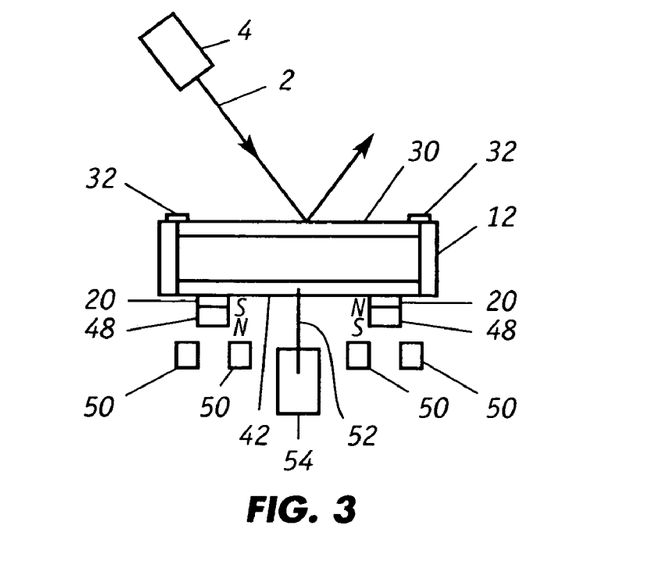
FIG. 3 is a cross sectional view of the mirror tilt stage that is equipped with permanent magnets and associated electric coils.

The mirror mounted tilt stage further includes a mechanism for tilting the mirror in a desired direction and to a desired extent about the support point. As shown in FIG. 3, in a preferred embodiment, each of the mounts 20 has a permanent magnet 48 mounted on its backside and each magnet 48 has a stationary electrical winding 50 (or coil) associated therewith. The mount assembly 12, which includes the mirror 30 that is secured by the brackets 32, is supported by a single elongated support member 52 that has a distal tip which is attached to an aperture or indentation on the exterior surface 42 of the base. A preferred support member is a spring wire that has a diameter of from about 0.025 mm to 1.6 mm. A larger diameter wire may be preferred if the stage is tilted at high angles or if the stage is scanned at high frequencies. The support member 52 has a proximal end which is embedded in the stationary base unit 54. Current flowing through each coil creates an magnetic field which interacts with the permanent magnetic field of the associated permanent magnet. This causes the permanent magnet to be attracted to or repelled from the coil which in turn tilts the surface of the mirror relative to the incident light beam 2 that is generated by the light source 4. The permanent magnets are preferably light-weight rare-earth magnets such as, for example, neodymium iron boron magnets. The support member is preferably single vertical wire which permits the mirror to be somewhat rigid when no deflection is desired. The mirror mounted tilt stage is preferably designed to operate below mechanical resonance.

Figure 4:
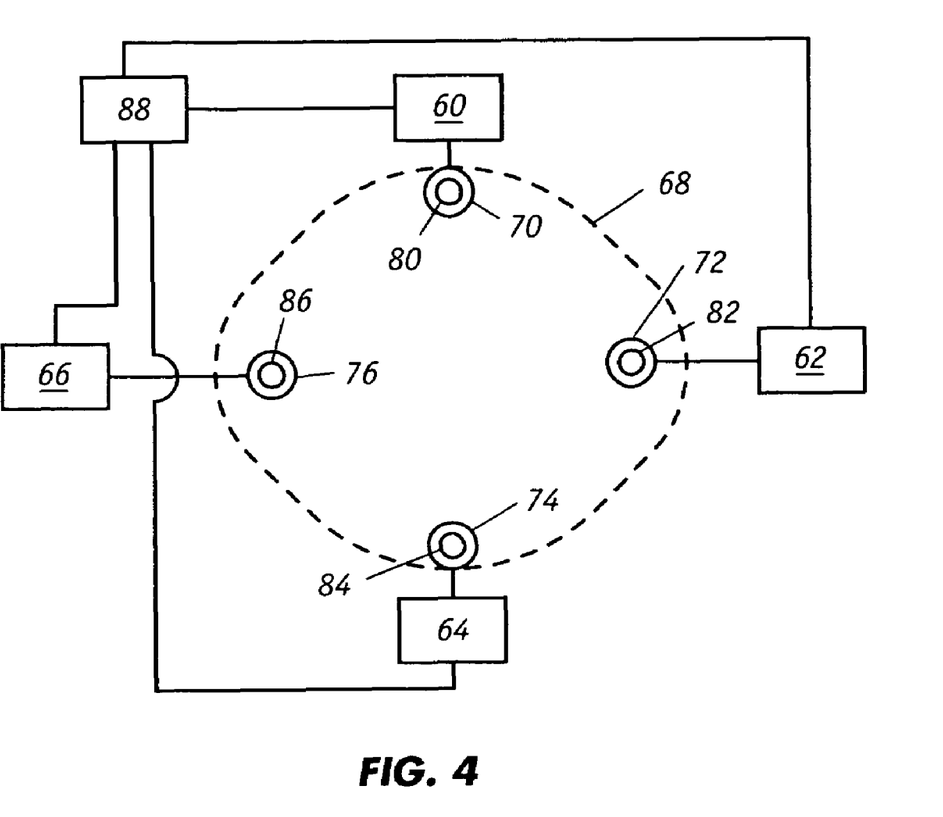
FIG. 4 is a schematic of the arrangement of the permanent magnets and associated electric coils for the mirror tilt stage.
Figure 5:
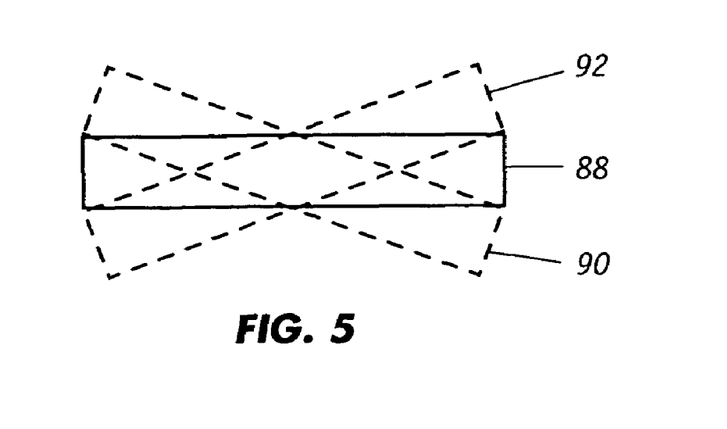
FIG. 5 illustrates the oscillating movement of the mirror tilt stage.

FIG. 4 shows the relative positions of the four permanent magnet/coil assemblies and their associated current sources that are positioned below the mirror mounted stage 68. Specifically, the (1) first assembly includes a permanent magnet 80, coil 70, and current source 60, (2) second assembly includes a permanent magnet 82, coil 72, and current source 62, (3) third assembly includes a permanent magnet 84, coil 74, and current source 64, and fourth assembly includes a permanent magnet 86, coil 76, and current source 66. As is apparent, the first assembly is positioned opposite to the third assembly and the second assembly is positioned opposite to the fourth assembly. The current sources are controlled by computer 88. In operation, alternating or direct current is applied to the coils in a synchronized fashion which causes the stage 68 to tilt in a desired manner. In one embodiment as illustrated in FIG. 5, the stage 88 oscillates between two positions 90 and 92.

The poles of the permanent magnets are preferably arranged so that the north and south poles of one assembly are oppositely arranged relative to those positioned on the opposite side of the stage. As shown in FIG. 3, the north and south poles of opposite permanent magnets, e.g., of the first and third assemblies of FIG. 4, are arranged so that the direction of magnetization of the one magnet is opposite to that of the other magnet. In this arrangement, one pair opposite positioned assemblies controls the x tilt and the other pair controls the y tilt of the mirror mounted tilt stage. While four permanent magnets and associated coils are preferably employed with the mirror mounted tilt stage, it is understood that the present invention can employed fewer or more such magnet/coil combinations. The tilt stage is preferably constructed of light weight metal, such as aluminum, and other materials which do not outgas in vacuum. For EUV applications, the actuators are preferably driven so that the reflective surface moves through a range of angles that can be ±10 degrees in the x-z plane about the y axis and ±10 degrees in the y-z plane about the x axis where the x-y plane is a target plane. Preferably, the desired range of angles is about ±2 degrees for both axes. Typically, the actuators are driven so as to cause the frame or stage to move at a scan frequency of between 0 and 90 Hz, or higher.

Figure 6:
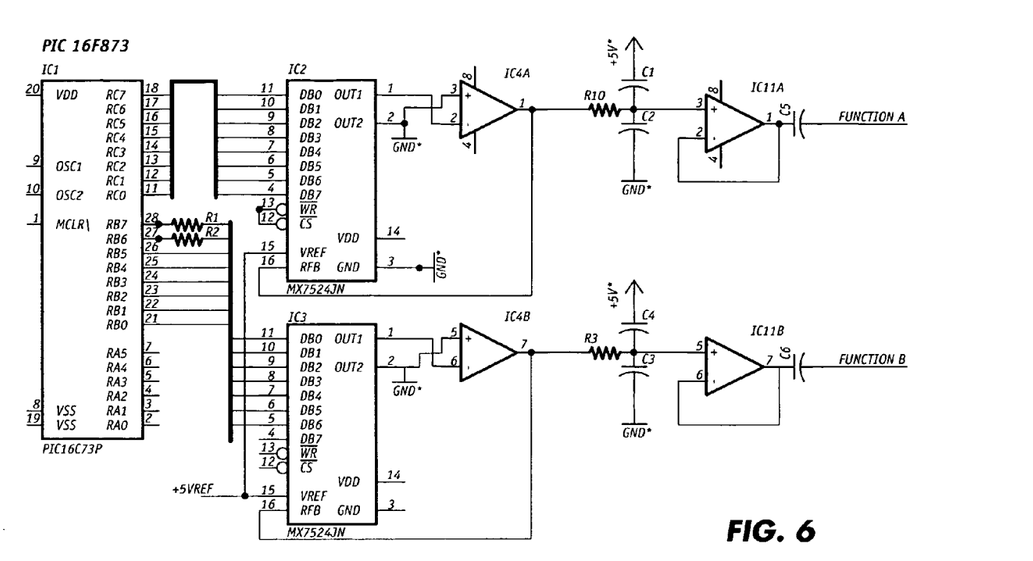
FIG. 6 is a circuit diagram for a two channel programmable function generator for an illumination pattern.
Figure 7:
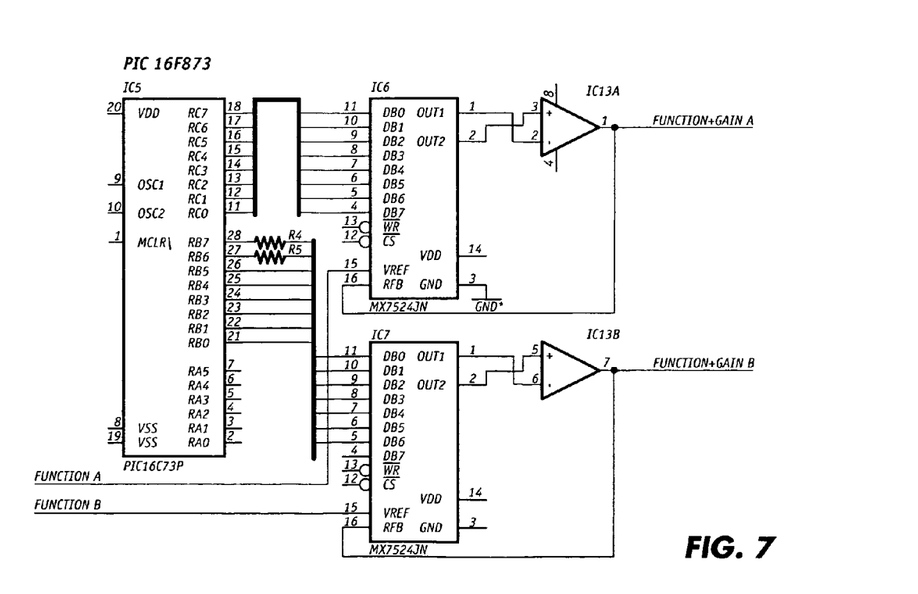
FIG. 7 is a circuit diagram for a time variable gain controller.
Figure 8:
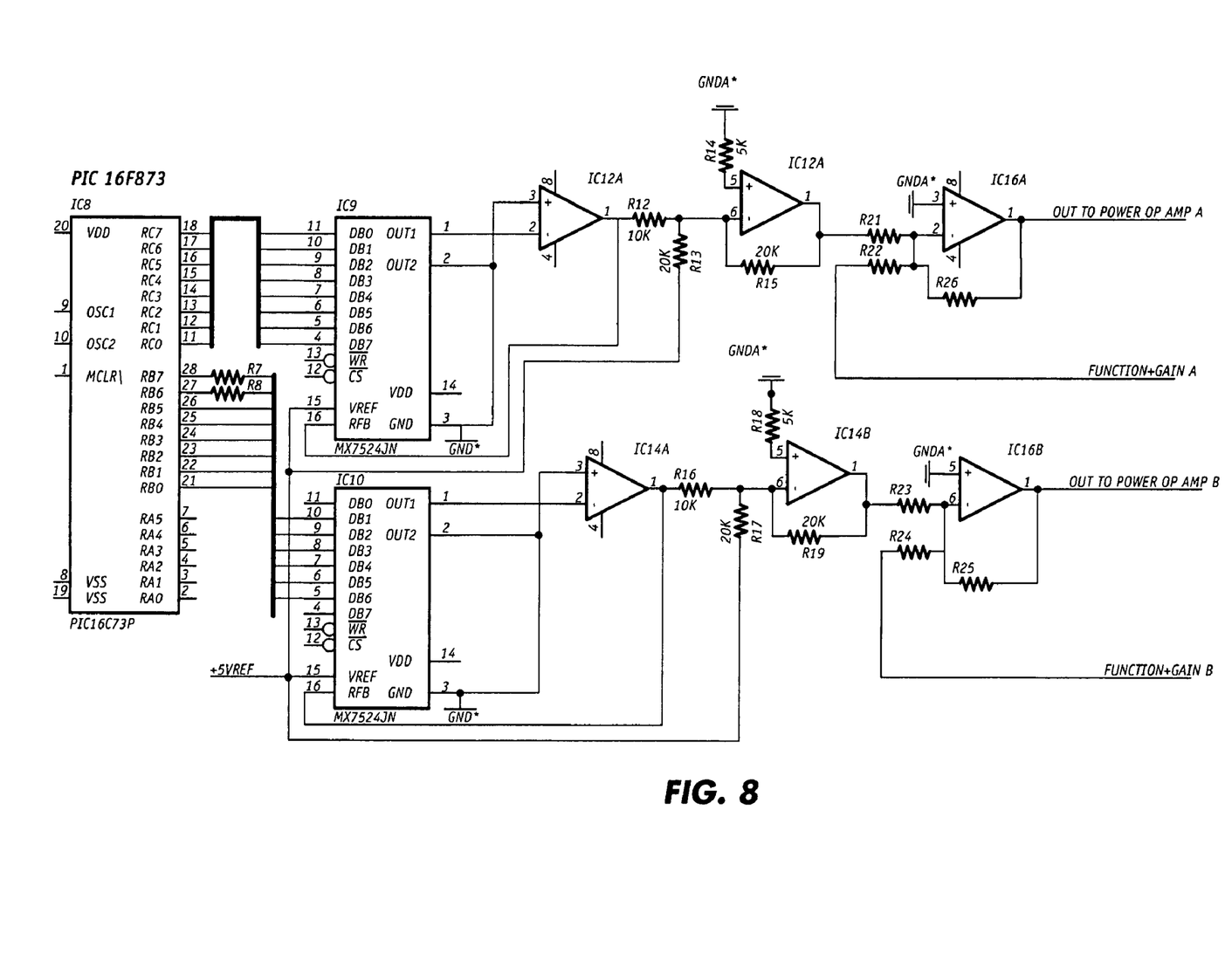
FIG. 8 is a circuit diagram for a two channel programmable offset controller for a D.C. offset control variable with time or static.

In another aspect of the present invention, the two-axes tilt scanner employs an electronic drive system that is preferably completely programmable. In one embodiment, the drive system comprises a two-channel system that employs three FLASH programmable microprocessors which are commercially available from Microchip Technology, Inc. (Chandler, Ariz.). One microprocessor is used for each of the three modular functional blocks as shown in FIGS. 6-8 and described herein. Each microprocessor controls two 8-bit digital-to-analog converters (DAC). One 8-bit DAC is used for each channel of each modular functional block. This arrangement enables modular code development. Each modular functional block preferably has a dedicated function in producing the potentially complex scan pattern and combination of the individual modular functions is achieved through analog circuitry.

The first modular block (the function block) provides for the basic scan function such, for example, as a circle, stripe, or ellipse. This is achieved through two drive channels, one for each scan axis. Each drive channel can be programmed to put out arbitrary 8-bit resolution analog voltages using conventional microprocessor programming techniques in combination with the DACs. The repeat-rate of this basic pattern is also programmable and controlled by the function block. For example, to generate a basic circle, channel A of the function block would be programmed to put out a sine wave and channel B of the function block would be programmed to put out a sine wave 90 degrees out of phase with channel A. The function waveforms can be defined with up to 8000 data points.

The function block, as illustrated in the circuit diagram in FIG. 6, has a FLASH programmable microprocessor stage, IC1, that generates and provides the programmed time-varying digital control signals that define the function waveforms that are modified by subsequent stages. The function block further includes a digital-to-analog conversion stage comprising an 8-bit buffered multiplying DAC, IC2, and an operational amplifier (op amp), IC4A, connected together for unipolar operation that converts the digital signals from IC1's I/O port C(RC0-RC7) into stable buffered analog signals at pin 1 of IC4A for channel A, and identically connected, IC3 and IC4B converts the signals from IC1's I/O port B (RB0-RB7) into stable buffered analog signals at pin 7 of IC4B. Finally, the function block includes a filter stage comprising passive filter elements resistor R10, capacitors C1 and C2 that filters the output of IC4A, followed by an op amp, IC11A, connected in a noninverting voltage follower configuration that buffers the filtered signal, followed by C5 that AC couples the channel A output to the subsequent stage, and identically, R3, C3, C4, IC11B, and C6 for channel B.

The second block (the gain block) provides for amplitude control of the function block output. This enables time variable gain control of the basic function. As with the function block, the gain block allows for the 8-bit resolution control of the gain and timing control of the gain modulation. The output of this modular block is an analog waveform that is produced from the waveform generated by the function block multiplied by the time varying value generated by the microprocessor of the gain block. For example, to generate a solid disk from the circle function described above, the gain function could be programmed to change after each circle cycle ranging from a gain of zero to a gain appropriate for the desired disk size.

The gain block, as illustrated in the circuit diagram in FIG. 7 has a FLASH programmable microprocessor stage, IC5, that generates and provides the programmed time-varying digital control signals that define the gain waveforms that are modified by subsequent stages. In addition, the gain block includes a digital-to-analog conversion stage comprising an 8-bit buffered multiplying DAC, IC6, and an op amp, IC13A, connected together for unipolar operation, that converts the digital signals from I/O port C(RC0-RC7) of IC5 into stable buffered analog signals that are a multiple of the signal at VREF of IC6 (Function A from the function module) at pin 1 of IC13A for channel A, and identically, IC7 and IC13B converts the signals from I/O port B (RB0-RB7) of IC5 into stable buffered analog signals that are a multiple of the signal at VREF of IC7 (Function B from the function module) at pin 7 of IC13B for channel B.

The third block (the offset block) provides for a DC offset value to be added to the function/gain signal produced by the first two blocks. This allows the pattern to be placed statically at any place within the angular range of the tilt mirror. Again, the offset block allows for the 8-bit resolution control of the DC offset and timing control of the offset modulation. This enables the amplitude-modulated function described above to be replicated at various positions over time. For example, to produce a bipolar scan pattern comprising two disk patterns that are offset spatially from each other, the offset block could be programmed to switch between two voltages with the switch rate set to match the time it takes to scan out the full disk described above. The voltage difference between the two voltages is set to produce the desired spatial separation of the disk-shape scan patterns.

The offset block, as illustrated in the circuit diagram in FIG. 8 has a FLASH programmable microprocessor stage, IC8, that generates and provides the programmed time-varying digital control signals that define the offset waveforms that are modified by subsequent stages. In addition, the offset block includes a digital-to-analog conversion stage comprising an 8-bit buffered multiplying DAC, IC9, 2 op amps, IC12A, IC12B, and resistors R12-R15, connected together for bipolar operation, that converts the digital signals from I/O port C(RC0-RC7) of IC9 into stable buffered bipolar analog signals at pin 7 of IC12B for channel A, and identically connected, IC10, IC14A, IC14B, and R16-R19, converts the signals from I/O port B (RB0-RB7) of IC10 into stable buffered bipolar analog signals at pin 7 of IC12B for channel B.

A summing stage that sums the output (Function*Gain) from the gain module with the offset signal to produce a signal equal to (function*gain)+offset. The summing stage comprises op amp IC16, input resistors R21-R22, and feedback resistor R26, connected in an inverting summing amplifier configuration for channel A, and identically connected IC16B, R23-R24, and R25, for channel B.

The outputs from the DC offset module is coupled to the input of the power op amps that provides the modulated drive current to the scan coils on the tilt stage. The power op amps serves to provide a high impedance input for the offset module to drive. An example of the scan pattern that can be produced with the invention along with the scan characteristic controlled by each module is shown in FIG. 9.

Figure 9:
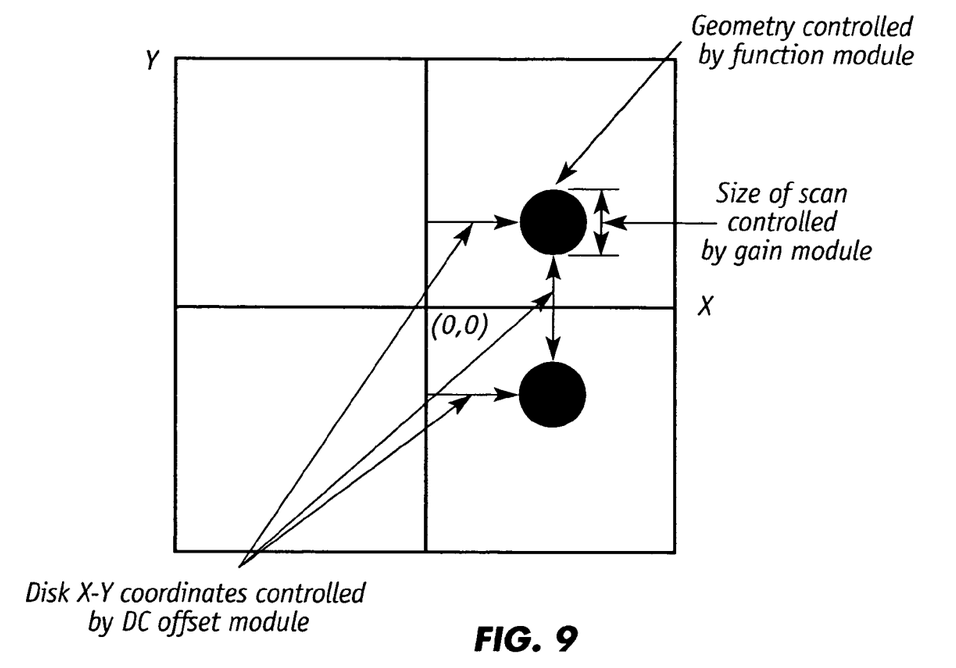
FIG. 9 is an example of a scan pattern that can be produced within the tilt range of the scanning stage and the controlling modules for each scan characteristic.

To generate the disk geometry indicated by the two circular patterns in FIG. 9, the function module is used to generate a basic circle by programming channel A of the function block to put out a sine wave and channel B of the function block to put out a sine wave 90 degrees out of phase with channel A. The diameter of this basic circle is determined by the programmed gain in the gain module since the amplitudes of the drive signals from channels A and B of the gain module output is equal to the input function signal amplitudes multiplied by the corresponding programmed gain values. The gain values can be programmatically altered for each cycle of the function module waveform to progressively vary the diameter of the circular scans from 0 to some desired value, thus forming a circular disk pattern. The position of the center of the circular disk pattern with respect to the origin of the scan pattern is determined by the DC offset module output. The DC offset module output is a signal that corresponds to the function module signal multiplied by the gain module signal and subsequently summed with the DC offset signal. This DC offset signal serves to shift the circular disk pattern to desired positions on the scan target.

In FIG. 9, the circular disk is replicated at opposite sides of the X axis and to the right of the Y axis by using a constant DC offset signal on the channel controlling the X positions and 2 different DC offset signals for the channel controlling the Y positions. The circular disk patterns are formed sequentially by first using one set of DC offset signals (for example, 1 VDC for channel A and 1 VDC for channel B) for the first disk pattern and then changing to the second set of DC offset signals (for example, 1 VDC channel A and −1 VDC for channel B) for the second circular disk pattern.

Figure 10:
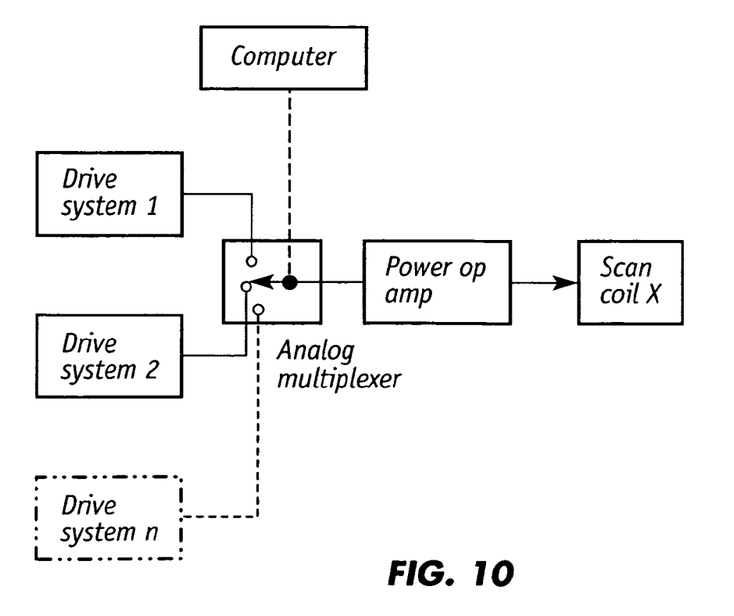
FIG. 10 shows the rapid scan program selection schema for a single channel of the drive system.

Complete reprogramming of the system can be achieved in approximately 1 minute. If more rapid switching is desired, the system described above can be replicated and a computer controlled analog multiplexer can be used to select the desired output. This is illustrated in the block diagram in FIG. 10 which shows drive systems 1 through n, where n>1, whose output are multiplexed through a computer controlled analog multiplexer into the input of the power op amp stage that drives the scan coils. Although only one of the channels is shown, the other channel is connected identically. Each drive system is preprogrammed with a different scan pattern that can be rapidly selected by the analog multiplexer under the control of the computer. This eliminates the time required to reprogram by flashing the 3 microprocessors in each drive system.

Figure 11:
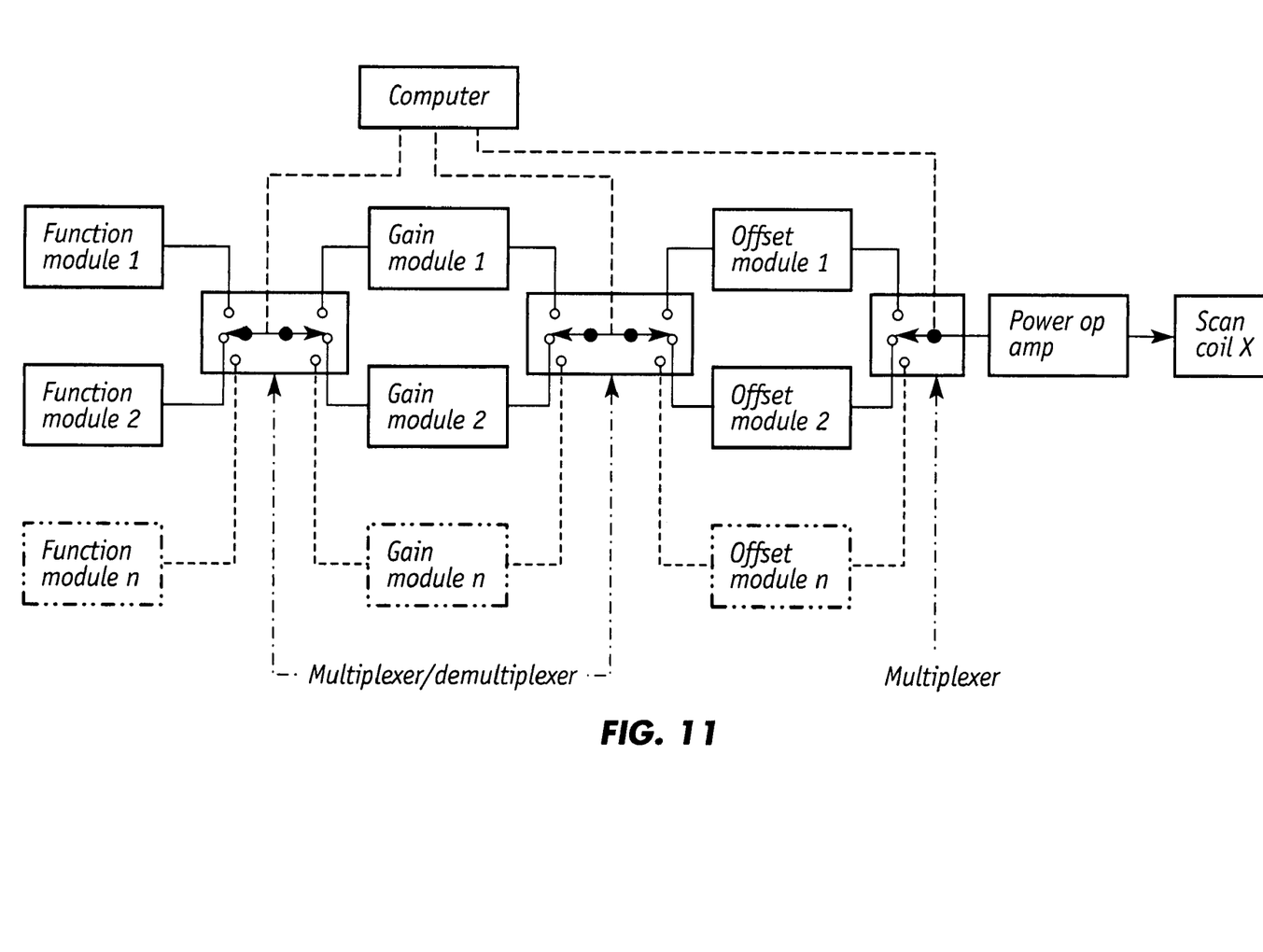
FIG. 11 shows a generalized computer controlled function, gain, and offset rapid selection schema for a single channel of the drive system.

Even more generally the computer controlled analog multiplexer/demultiplexer could choose from one of the available function blocks, one of the available gain blocks, and one of the available offset blocks, greatly increasing the instantly available scan options by allowing the rapid selection of one permutation out of all possible permutations. This is illustrated in the block diagram in FIG. 11. Each module of each system is connected to the next module through a computer controlled analog multiplexer/demultiplexer. FIG. 11 shows drive systems 1 through n, where n>1, that has the n function modules interconnected to the n gain modules through a computer controlled analog multiplexer/demultiplexer. The n gain modules are in turn interconnected to the n DC offset modules through a computer controlled analog multiplexer/demultiplexer. The output from the DC offset modules are connected to the power op amp that drives the scan coil through a computer controlled analog multiplexer. This design enables rapid selection of scan programs by eliminating the time required to reprogram by flashing the microprocessors in each drive system. It further enables the selection of more scan patterns with fewer modules than the system illustrated above in FIG. 10.

A vacuum-compatible 2-dimensional tilt stage similar to that shown in FIGS. 1-3 was constructed. The aluminum tilt stage was dimensioned to accommodate one inch (25.4 mm) diameter, 0.25 inch (6.35 mm) thick mirror substrates. The mirror included a multilayer stack that reflected EUV radiation. The mirror mounted tilt stage was supported by a single 0.024 inch (0.61 mm) diameter round spring wire that was attached at the center of the aluminum mount which had a corresponding 0.024 inch (0.61 mm) hole drilled therein. This arrangement provided a simple and compact friction-free mechanical design.

Figure 12:
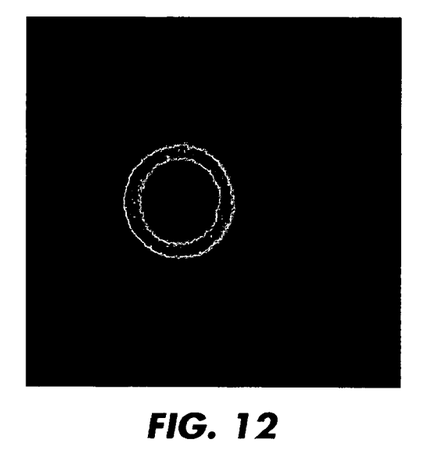
FIG. 12 shows a He—Ne laser beam scanned through an annulus.
Figure 13:
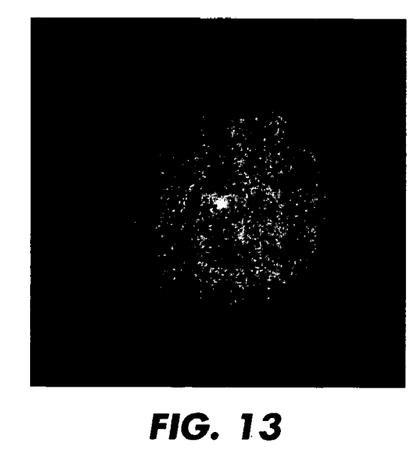
FIGS. 13 to 16 are scan patterns that are formed on targets and that were generated by a scanned EUV beam in vacuum.
Figure 14:
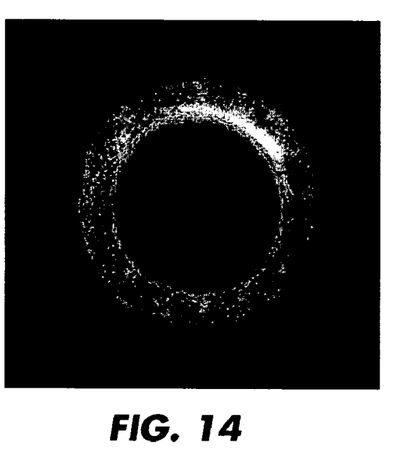
Figure 15:
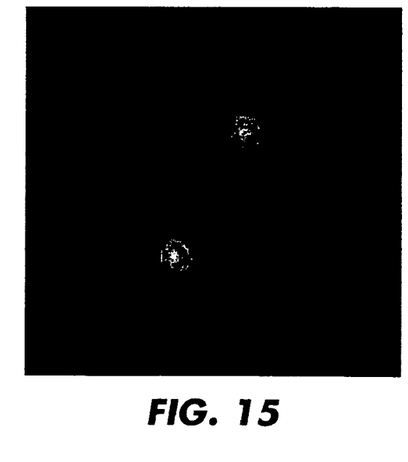
Figure 16:
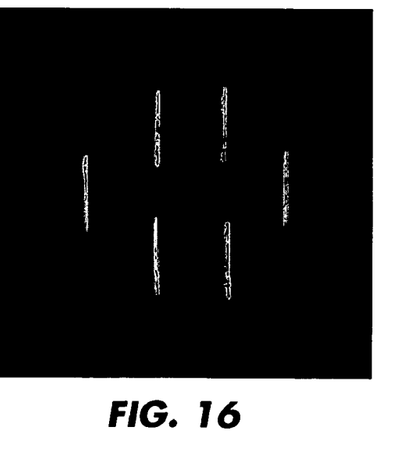

The tilt stage was equipped with four rare-earth permanent magnets that were attached on the backside of the aluminum mount. The four magnets and their associated coils and current sources operated as two push pull pairs. One pair controls x tilt and the other pair controls y tilt. Scanning was achieved by running current through the coils so that as current passed through one coil pair, one coil pulled on the magnet above it and the opposite coil pushed the magnet above it. The system is designed to operate somewhat below mechanical resonance, and a scanning frequency of approximately 85 Hz have been achieved. FIG. 12 shows a He—Ne laser beam scanned through an annulus using the above-described device operating at air. FIGS. 12-16 are far field patterns produced by a scanned EUV beam in vacuum.

The inventive tilt stage is particularly suited for EUV lithography applications wherein a beam of EUV radiation, which can be coherent or non-coherent, is scanned through a set of angles to create scan patterns at the entrance pupil of an illumination optics. Suitable lithographic optics are described, for example, in U.S. Pat. Nos. 6,226,346, 6,072, 852, and 6,033,079 each to Hudyma and U.S. Pat. No. 6,188,513 to Hudyma et. al. which are all incorporated herein by reference.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A mirror mounted tilt stage that comprises:
   (a) a stationary base unit;
   (b) a frame having a mirror mounted thereon wherein the mirror has a reflective surface and having a base that has an aperture or indentation on a surface thereof;
   (c) a single pivot member that comprises an elastic bending wire having a distal end that is attached to the stationary base unit and a proximal end wherein the aperture or indentation on the base is dimensioned to accommodate the proximal end and characterized in that the frame is suspended on the single pivot member and the proximal end pivotally supports the frame such that the frame pivots in two directions;
   (d) actuator means for tilting the frame that comprises four permanent magnets and each with an associated electric coil activatable by electric current wherein the permanent magnets are mounted to the frame and arranged along perpendicular axes and the permanent magnets are arranged in diametrically opposite sides; and
   (e) means for driving the actuator means to move the reflective surface through a predetermined range of angles in two nonparallel planes.

2. The stage of claim 1 wherein the actuator means enables orthogonal tilting of the mirror.

3. The stage of claim 1 wherein opposite pairs of electric coils have their winding connected together such that an electrical current passing through one pair causes tilt about one axis of the mirror while an electrical current passing through the other pair causes tilt about an orthogonal axis.

4. The stage of claim 1 wherein the permanent magnet comprises an annular permanent magnet.

5. The stage of claim 1 wherein the pivot member comprises a spring wire.

6. The stage of claim 5 wherein the spring wire has a diameter of from 0.025 mm to 1.6 mm.

7. The stage of claim 1 wherein the mirror comprises a multilayer that reflects extreme ultra-violet radiation.

8. The stage of claim 1 wherein the means for driving the actuator means comprises rapidly programmable function generators that generates analog signals that modulate the drive currents to each electric coil.

9. The stage of claim 1 wherein the predetermined range of angles comprises ±10 degrees in the x-z plane about the y axis and ±10 degrees in the y-z plane about the x axis where the x-y plane is a target plane.

10. The stage of claim 1 wherein the means for driving the actuator means causes the frame to move at a scan frequency of at least 90 Hz.

11. The stage of claim 1 wherein the scan frequency is between 0 to 90 Hz.

12. The stage of claim 1 wherein the aperture or indentation on the surface of the base is a support point and the proximal end of the pivot member is positioned thereon.

13. A method for producing a reflected light scan pattern that comprises the steps of:
   (a) providing a mirror mounted tilt stage that comprises:
      (i) a stationary base unit;
      (ii) a frame having a mirror mounted thereon wherein the mirror has a reflective surface and having a base that has an aperture or indentation on a surface thereof;
      (iii) a single pivot member that comprises an elastic bending wire having a distal end that is attached to the stationary base unit and a proximal end wherein the aperture or indentation on the base is dimensioned to accommodate the proximal end and characterized in that the frame is suspended on the single pivot member and the proximal end pivotally supports the frame such that the frame pivots in two directions and the frame is suspended on the single pivot member;
      (iv) actuator means for tilting the frame that comprises four permanent magnets and each with an associated electric coil activatable by electric current wherein the permanent magnets are mounted to the frame and arranged along perpendicular axes and the permanent magnets are arranged in diametrically opposite sides; and
      (v) means for driving the actuators to move the reflective surface through a predetermined range of angles in two dimensions;
   (b) directing a beam of light into the reflective surface; and
   (c) moving the retlective surface through a range of angles in two nonparallel planes to scan the beam through a set of angles to create the scan pattern on a target.

14. The method of claim 13 wherein the actuator means enables orthogonal tilting of the mirror.

15. The method of claim 13 wherein opposite pairs of electric coils have their winding connected together such that an electrical current passing through one pair causes tilt about one axis of the mirror while an electrical current passing through the other pair causes tilt about an orthogonal axis.

16. The method of claim 13 wherein the permanent magnet comprises an annular permanent magnet.

17. The method of claim 13 wherein the predetermined range of angles comprises ±10 degrees in the x-z plane about the y axis and ±10 degrees in the y-z plane about the x axis where the x-y plane is a target plane.

18. The method of claim 13 wherein the means for driving the actuators causes the frame to move at a scan frequency of at least 90 Hz.

19. The method of claim 13 wherein the scan frequency is between 0 to 90 Hz.

20. The method of claim 13 wherein in step (c) the scan pattern is formed at the entrance of an illuminator optics.

* * * * *